(12) United States Patent
Cho et al.

(10) Patent No.: US 10,963,086 B2
(45) Date of Patent: *Mar. 30, 2021

(54) DISPLAY DEVICE INCLUDING A TOUCH SENSOR AND A METHOD OF MANUFACTURING THE SAME

(71) Applicant: SAMSUNG DISPLAY CO., LTD., Yongin-si (KR)

(72) Inventors: Yusung Cho, Asan-si (KR); Kyungil Kang, Hwaseong-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 0 days.

This patent is subject to a terminal disclaimer.

(21) Appl. No.: 16/898,888

(22) Filed: Jun. 11, 2020

(65) Prior Publication Data

US 2020/0303681 A1   Sep. 24, 2020

Related U.S. Application Data

(63) Continuation of application No. 15/806,853, filed on Nov. 8, 2017, now Pat. No. 10,691,237.

(30) Foreign Application Priority Data

Jan. 18, 2017  (KR) ........................ 10-2017-0008555

(51) Int. Cl.
*H01L 33/00* (2010.01)
*H01L 21/00* (2006.01)
(Continued)

(52) U.S. Cl.
CPC .......... *G06F 3/0412* (2013.01); *H01L 27/323* (2013.01); *H01L 27/3276* (2013.01);
(Continued)

(58) Field of Classification Search
CPC .......................... H01L 27/323; H01L 31/0481
(Continued)

(56) References Cited

U.S. PATENT DOCUMENTS 9,941,338 B2   4/2018   Seo et al.
10,249,843 B2  4/2019   Yang et al.
(Continued)

FOREIGN PATENT DOCUMENTS

JP    2013-016371    1/2013
KR    10-2014-0046267    4/2014
(Continued)

OTHER PUBLICATIONS

Korean Office Action issued in corresponding application No. 10-2017-0008555 dated Dec. 21, 2018.

*Primary Examiner* — Calvin Lee
(74) *Attorney, Agent, or Firm* — F. Chau & Associates, LLC

(57) ABSTRACT

A display device includes a substrate, a pad electrode, a pixel electrode, an opposite electrode, an encapsulation member, a planarization layer, and a conductive layer. The substrate includes a display region and a peripheral region. The pad electrode is disposed on the substrate in the peripheral region. The pixel electrode and the opposite electrode are disposed on the substrate in the display region. The encapsulation member is disposed on the opposite electrode. The planarization layer is disposed on the encapsulation member in the display region and the peripheral region. The conductive layer is disposed on the planarization layer. The planarization layer includes a contact hole exposing at least a portion of the pad electrode. The conductive layer contacts the portion of the pad electrode exposed through the contact hole.

18 Claims, 13 Drawing Sheets

(51) Int. Cl.
 G06F 3/041 (2006.01)
 H01L 27/32 (2006.01)
 H01L 51/52 (2006.01)
 G06F 3/044 (2006.01)

(52) U.S. Cl.
 CPC .......... *H01L 51/5256* (2013.01); *G06F 3/044* (2013.01); *G06F 2203/04103* (2013.01); *H01L 2227/323* (2013.01)

(58) Field of Classification Search
 USPC ............................... 438/25, 64; 257/98–100
 See application file for complete search history.

(56) References Cited

U.S. PATENT DOCUMENTS

| | | | |
|---|---|---|---|
| 10,347,699 B2* | 7/2019 | Kwon | H01L 27/323 |
| 10,691,237 B2* | 6/2020 | Cho | H01L 27/3276 |
| | | | 257/100 |
| 2018/0203554 A1 | 7/2018 | Cho et al. | |

FOREIGN PATENT DOCUMENTS

| | | |
|---|---|---|
| KR | 10-2015-0007062 | 1/2015 |
| KR | 10-2015-0080257 | 7/2015 |
| KR | 10-2016-0079744 | 7/2016 |
| KR | 10-2016-0124319 | 10/2016 |

\* cited by examiner

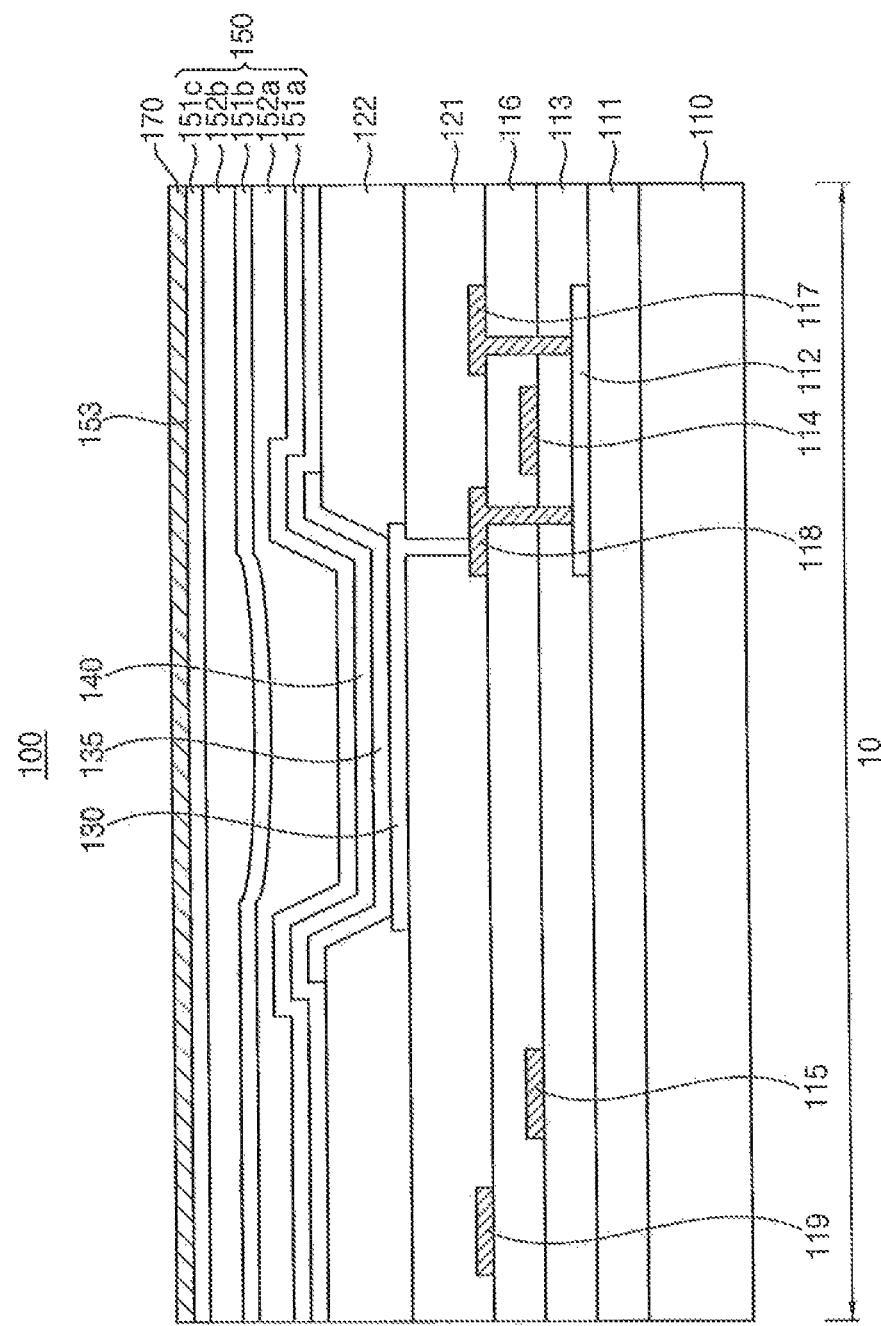

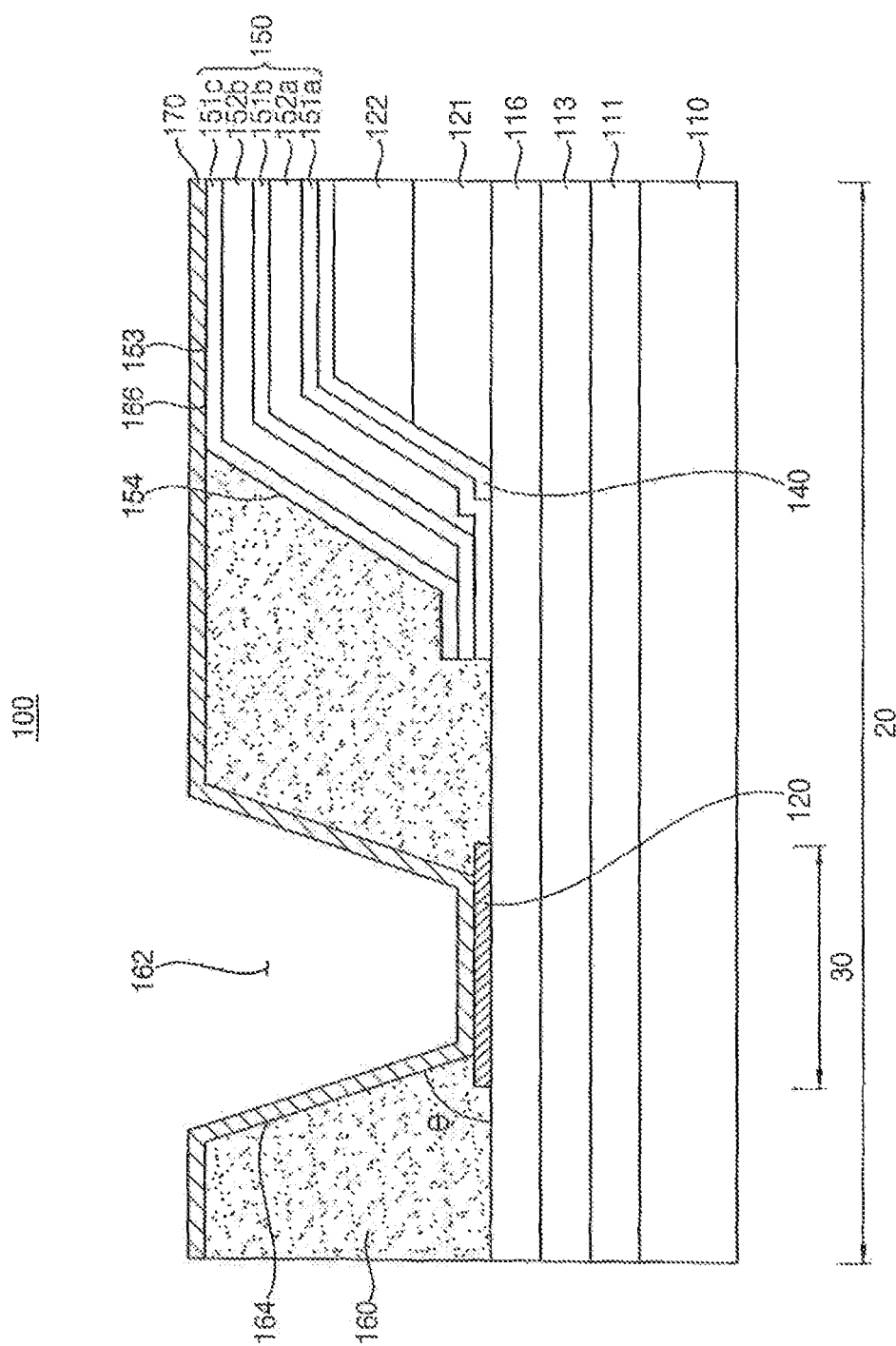

DISPLAY DEVICE INCLUDING A TOUCH SENSOR AND A METHOD OF MANUFACTURING THE SAME

CROSS-REFERENCE TO RELATED APPLICATION

This application is a Continuation of U.S. patent application Ser. No. 15/806,853, filed on Nov. 8, 2017, now U.S. Pat. No. 10,691,237 issued Jun. 23, 2020, which claims priority under 35 U.S.C. § 119 to Korean Patent Application No. 10-2017-0008555, flied on. Jan. 18, 2017 in the Korean Intellectual Property Office, the disclosures of which are incorporated by reference herein in their entirety.

TECHNICAL FIELD

Exemplary embodiments of the present invention relate to a display device, and more particularly to a display device including a touch sensor and a method of manufacturing the same.

DISCUSSION OF RELATED ART

Display devices such as liquid crystal displays (LCD), organic light-emitting diode (OLED) displays, and electrophoretic displays may include a field generating electrode and an electro-optical active layer. For example, an organic light-emitting diode (OLED) display device may include an organic light-emitting layer as the electro-optical active layer. The field generating electrode may be connected to a switching element such as a thin film transistor to receive a data signal. The electro-optical active layer may convert the data signal into an optical signal to display an image.

When external impurities such as moisture or oxygen penetrate into a display device, a life of an electric element included in the display device may be shortened. In an organic light-emitting device, the light emission efficiency of an emission layer may deteriorate and may become deformed.

In order to reduce or prevent impurities such as moisture from penetrating into the display device, an encapsulation process may be performed on the electric element included in the display device in order to separate the electric element from the outside. The encapsulation process may include a method of laminating a layer including an organic polymer such as PET or polyester on a lower substrate on which, for example, thin film transistors and an emission layer are formed. The encapsulation process may include a method of forming a cover or a cap as an encapsulation substrate and sealing the edges of the lower substrate and the encapsulation substrate using a sealant. The encapsulation process may include a method of forming an encapsulation member including the encapsulating thin film layers. The encapsulating thin film layers may be formed by depositing a plurality of thin films on the lower substrate, for example, instead of the encapsulation substrate.

In the method of forming the encapsulation member including the plurality of encapsulating thin film layers, the encapsulation member may be formed by alternately depositing a plurality of organic layers and a plurality of inorganic layers on the lower substrate. The encapsulating thin film layers may have a relatively high flexibility. Thus, the encapsulating thin film layers may be included in flexible display devices.

In addition to displaying an image, display devices may include a touch sensing function in which interaction with a user may be performed. The touch sensing function may detect touch information, such as whether an object approaches or contacts a screen, and a touch position thereof by sensing changes in, for example, pressure, charge, and light, applied to the screen by the display device. Changes in, for example, pressure, charge, and light, may be applied to the screen by the display device when the user writes text or draws figures by approaching or contacting an object, for example, a finger or a touch pen on the screen. The display device may receive an image signal based on the received touch information to display an image.

The touch sensing function of the display device may be implemented through a touch sensor. The touch sensor may be a resistive type touch sensor, a capacitive type touch sensor, an electro-magnetic (EM) type touch sensor, or an optical type touch sensor.

The touch sensor may be included in the display device (e.g., an in-cell type), formed on an outer surface of the display device (e.g., an on-cell type), or attached to a separate touch sensor part of the display device (e.g., an add-on cell type). When adhering the touch sensor part on the display device, additional processes for manufacturing the touch sensor part separately from the display panel and adhering the touch sensor part on the display device may be used. Thus, a manufacturing yield of the display device may decrease and a manufacturing cost of the display device may increase. In order to affix the touch sensor part on the display device, an adhesive layer may be positioned between the touch sensor part and the display device or on the touch sensor part. Accordingly, a thickness of the display device may increase. The adhered touch sensor part may decrease transmittance and increase reflectance of the display device. Thus, haze may increase in the display device. On-cell type forming of the touch sensor on the outer surface of the display device may be used, for example, to increase a transmittance of the display device, and to decrease reflectance and the occurrence of haze.

SUMMARY

Exemplary embodiments of the present invention provide a display device in which a conductive layer may be formed on an encapsulation member without increasing a dead space or increasing a parasitic capacitance.

Exemplary embodiments of the present invention provide a method of manufacturing the display device.

Exemplary embodiments of the present invention provide a display device. The display device includes a substrate, a pad electrode, a pixel electrode, an opposite electrode, an encapsulation member, a planarization layer, and a conductive layer. The substrate includes a display region and a peripheral region. The pad electrode is disposed on the substrate in the peripheral region. The pixel electrode and the opposite electrode are disposed on the substrate in the display region. The encapsulation member is disposed on the opposite electrode. The planarization layer is disposed on the encapsulation member in the display region and the peripheral region. The planarization layer includes a contact hole. The contact hole exposes at least a portion of the pad electrode. The conductive layer is disposed on the planarization layer. The conductive layer contacts the portion of the pad electrode exposed through the contact hole.

A sidewall of the planarization layer corresponding to the contact hole may have a tapered structure.

A taper angle of the sidewall may be in a range of from about 30 degrees to about 90 degrees.

The planarization layer may include a transparent organic material.

An upper surface of the planarization layer may be flat.

The encapsulation member may include an inorganic layer and an organic layer. The inorganic layer and the organic layer may be alternately layered with each other.

The inorganic layer may at least partially cover the organic layer.

The encapsulation member may include an upper surface and a sidewall. The upper surface may be flat in the display region. The sidewall may have a height that decreases in the peripheral region.

The planarization layer may expose the upper surface of the encapsulation layer.

The conductive layer may include a plurality of conductive lines. The plurality of conductive lines may be disposed in the contact hole and spaced apart from each other.

Exemplary embodiments of the present invention provide a method of manufacturing a display device. The method includes preparing a substrate including a display region and a peripheral region. A pad electrode is disposed on the substrate in the peripheral region. A pixel electrode and an opposite electrode are disposed on the substrate in the display region. The encapsulation member is disposed on the opposite electrode. The planarization layer is disposed on the encapsulation member in the display region and the peripheral region. The contact hole is disposed in the planarization layer. The contact hole exposes at least a portion of the pad electrode. The conductive layer is disposed on the planarization layer. The conductive layer contacts the portion of the pad electrode exposed through the contact hole.

The disposing of the contact hole may include disposing a mask on the planarization layer. The mask may include a light blocking portion and a light transmitting portion. The planarization layer may be exposed so that the light transmitting portion corresponds to the contact hole. The exposed planarization lay may be etched.

The exposing of the planarization layer may include a defocusing process in which at least one beam of light is focused in a direction opposite to an exposed surface of the planarization layer.

The defocusing process may further include focusing the at least one beam of light in a range from about 10 μm to about 15 μm from the exposed surface of the planarization layer.

A sidewall of the planarization layer corresponding to the contact hole may have a tapered structure.

A taper angle of the sidewall may be in a range of from about 30 degrees to about 90 degrees.

The planarization layer may include a transparent organic material.

An upper surface of the planarization layer may be flat.

The method may include patterning the conductive layer to form a plurality of conductive lines. The plurality of conductive lines may be disposed in the contact hole and may be spaced apart from each other.

The patterning the conductive layer may include forming a photoresist layer having a uniform thickness on the conductive layer. The photoresist layer may be etched to form a plurality of photoresist patterns corresponding to the plurality of the conductive lines. The conductive layer may be etched using the plurality of photoresist patterns as etch-stop patterns.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein:

FIG. 12 is a cross-sectional view illustrating a display region of a display device according to an exemplary embodiment of the present invention; and FIG. 13 is a cross-sectional view illustrating a peripheral region of a display device according to an exemplary embodiment of the present invention.

DETAILED DESCRIPTION OF THE EMBODIMENTS

Display devices and methods of manufacturing the display devices in accordance with exemplary embodiments of the present disclosure will be described in detail with reference to the accompanying drawings.

Hereinafter, a display device according to an exemplary embodiment of the present invention will be described in more detail below with reference to FIGS. 1, 2, 3, and 4.

Figure 1:
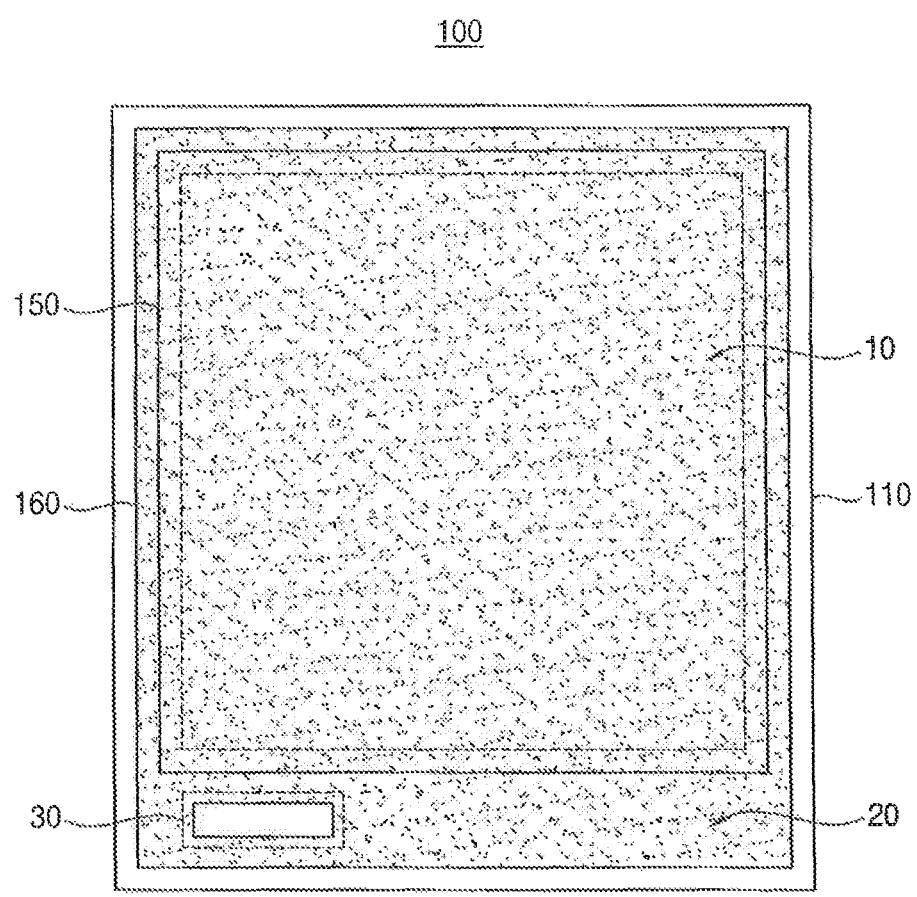
FIG. 1 is a plan view illustrating a display device according to an exemplary embodiment of the present invention.
Figure 2:
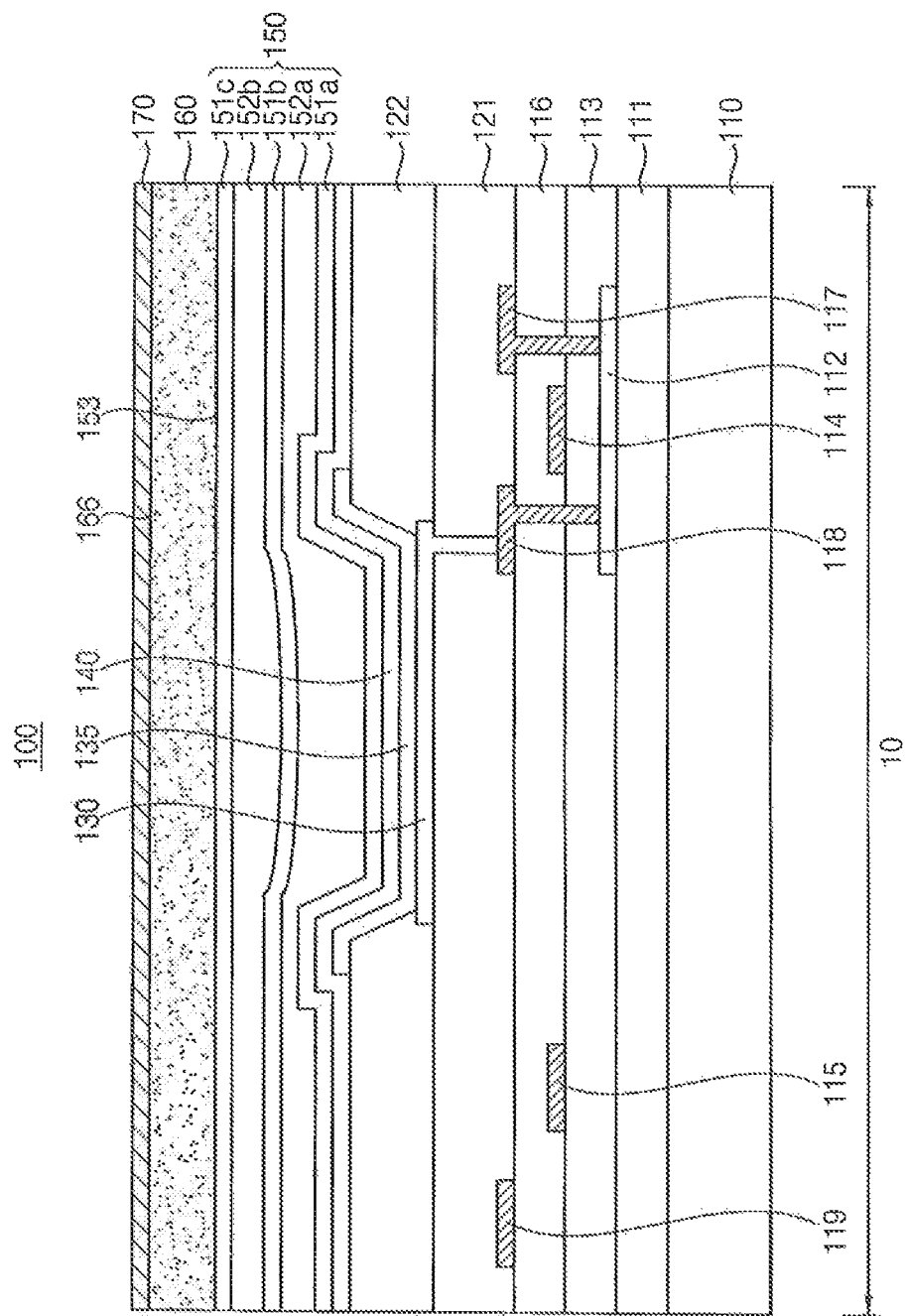
FIG. 2 is a cross-sectional view illustrating a display region of a display device according to an exemplary embodiment of the present invention.
Figure 3:
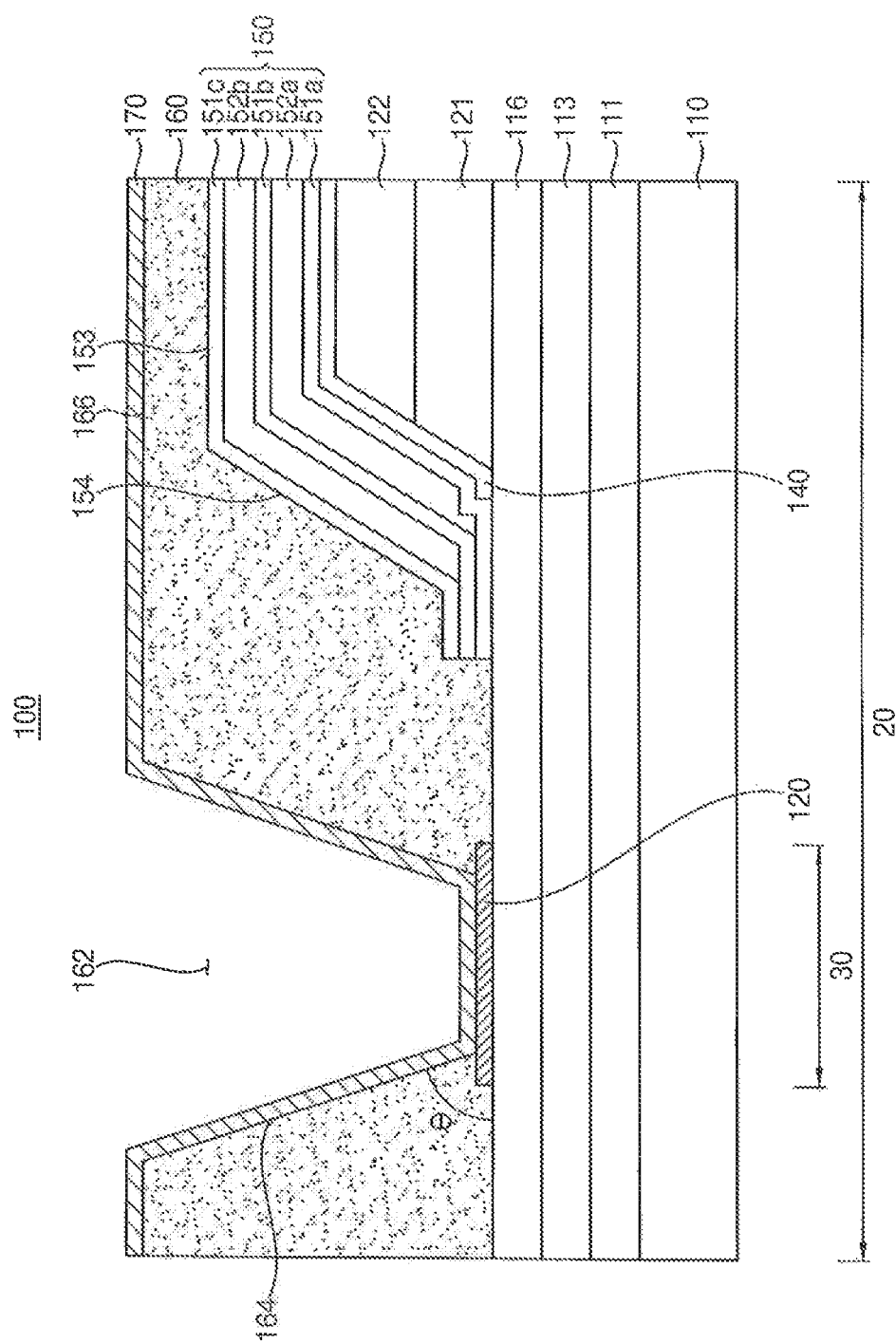
FIG. 3 is a cross-sectional view illustrating a peripheral region of a display device according to an exemplary embodiment of the present invention.
Figure 4:
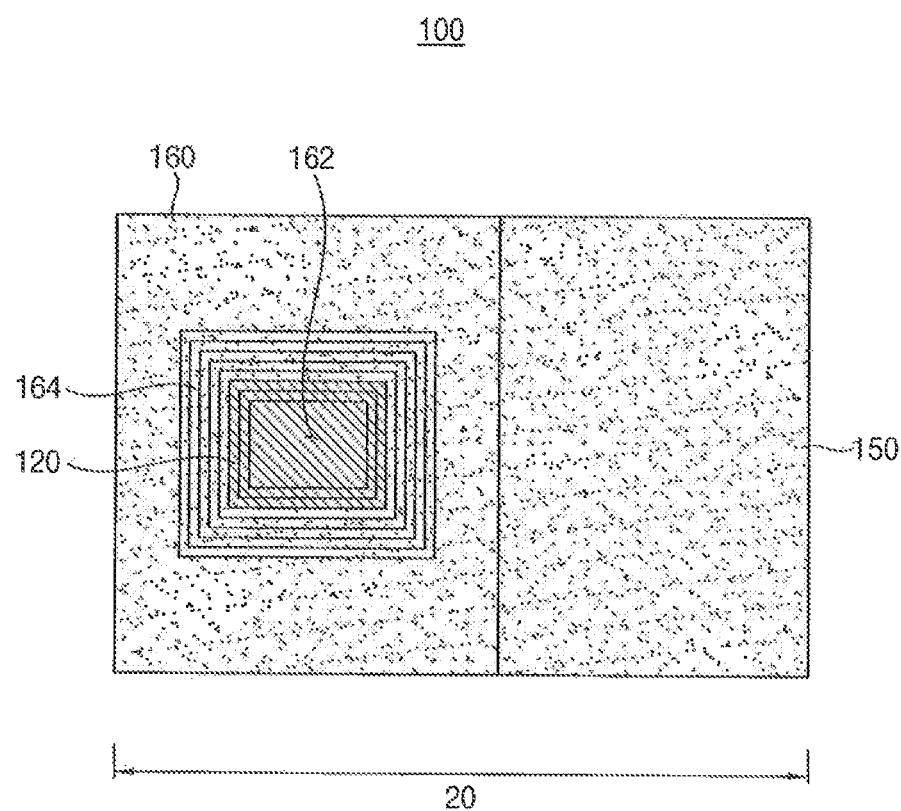
FIG. 4 is a plan view illustrating a peripheral region of a display device according to an exemplary embodiment of the present invention.

FIG. 1 is a plan view illustrating a display device according to an exemplary embodiment of the present invention. FIG. 2 is a cross-sectional view illustrating a display region of a display device according to an exemplary embodiment of the present invention. FIG. 3 is a cross-sectional view illustrating a peripheral region of a display device according to an exemplary embodiment of the present invention. FIG. 4 is a plan view illustrating a peripheral region of a display device according to an exemplary embodiment of the present invention.

Referring to FIG. 1, a display device 100 according to an exemplary embodiment of the present invention may include a substrate 110. The substrate 110 may include a display region 10 and a peripheral region 20. The display region 10 may display an image. The peripheral region 20 may be positioned outside the display region 10.

A plurality of pixels and a plurality of signal lines may be disposed in the display region 10. The plurality of signal lines may be connected to the plurality of pixels, for example, to transmit signals. The plurality of signal lines may include a plurality of gate lines and a plurality of data lines. The plurality of gate lines may transmit gate signals. The plurality of data lines may transmit data signals. The plurality of gate lines and the plurality of data lines may extend to cross each other. For example, the plurality of gate lines may extend in a first direction and the plurality of data lines may extend in a second direction substantially perpendicular to the first direction.

The plurality of pixels may be arranged in a matrix structure; however, an arrangement of the plurality of pixels is not limited thereto. Each of the pixels may include at least one switching element and a pixel electrode. The at least one switching element may be connected to each of the gate line and the data line. The pixel electrode may be connected to the switching element. For example, the switching element may be a thin film transistor (TFT). The switching element may be turned in an ON/OFF state, for example, according to the gate signal transmitted through the gate line. Thus, the data signal may be selectively transmitted through the data line to the pixel electrode.

A pad portion 30 may be disposed in the peripheral region 20. The pad portion 30 may be electrically connected to a touch sensor. The touch sensor may be disposed over the substrate 110. A plurality of pad electrodes may be disposed in the pad portion 30.

Referring to FIGS. 1, 2 and 3, the display device 100 may include the substrate 110, a pad electrode 120, a pixel electrode 130, an opposite electrode 140, an encapsulation member 150, a planarization layer 160, and a conductive layer 170.

The substrate 110 may include glass or plastic. The substrate 110 may be flexible. For example, the substrate 110 may include various plastics such as polyethylene terephthalate (PET), polyethylene naphthalate (PEN), polycarbonate (PC), polyarylate (PAR), polyetherimide (PEI), polyether sulfone (PES), polyimide (PI), a metal thin film, and/or a thin film glass.

A buffer layer 111 may be disposed on the substrate 110. The buffer layer 111 may be disposed on the substrate 110 in the display region 10 and the peripheral region 20 of the display device 100. The buffer layer 111 may reduce or prevent impurities from the outside from passing through the substrate 110 and permeating into an upper portion of the display device 100. An upper surface of the buffer layer 111 may be substantially flat. The buffer layer 111 may include at least one inorganic layer. For example, the buffer layer 111 may include silicon nitride (SiNx), silicon oxide (SiOx), and/or silicon oxynitride (SiOxNy).

An active pattern 112 may be disposed on the buffer layer 111. For example, the active pattern 112 may be disposed on at least a portion of the buffer layer 111. The active pattern 112 may be disposed in the display region 10 of the display device 100. The active pattern 112 may include a source region, a drain region, and a channel region. The source region and the drain region may be disposed at opposite sides of the active pattern 112. The channel region may be disposed between the source region and the drain region. The active pattern 112 may include an amorphous silicon, a polycrystalline silicon, and/or an oxide semiconductor.

Referring to FIG. 3, a gate insulation layer 113 may be disposed on the buffer layer 111. Referring to FIG. 2, the gate insulation layer 113 may be disposed on the buffer layer 111 and the active pattern 112. The gate insulation layer 113 may at least partially cover the active pattern 112. For example, the gate insulation layer 113 may cover an upper surface and side surfaces of the active pattern 112. The gate insulation layer 113 may include multiple layers. The gate insulation layer 113 may include at least one inorganic layer. For example, the gate insulation layer 113 may include silicon nitride (SiNx), silicon oxide (SiOx), and/or silicon oxynitride (SiOxNy).

A gate conductor may be disposed on the gate insulation layer 113. The gate conductor may be disposed in the display region 10 of the display device 100. The gate conductor may include a gate line 115 and a gate electrode 114. The gate line 115 may transmit a gate signal. The gate electrode 114 may be connected to the gate line 115. The gate electrode 114 may overlap at least a portion of the active pattern 112. For example, the gate electrode 114 may at least partially overlap the channel region of the active pattern 112.

An insulation interlayer 116 may be disposed on the gate insulation layer 113. The insulation interlayer 116 may at least partially cover the gate conductor. For example, the insulation interlayer 116 may cover side surfaces and an upper surface of each of the gate line 115 and the gate electrode 114 of the gate conductor. The insulation interlayer 116 may include multiple layers. The insulation interlayer 116 may include at least one inorganic layer. For example, the insulation interlayer 116 may include silicon nitride (SiNx), silicon oxide (SiOx), and/or silicon oxynitride (SiOxNy). The insulation interlayer 116 and the gate insulation layer 113 may each include a first contact hole and a second contact hole. The first contact hole may expose the source region of the active pattern 112. The second contact hole may expose the drain region of the active pattern 112.

According to an exemplary embodiment of the present invention, the buffer layer 111, the gate insulation layer 113, and the insulation interlayer 116 may each extend from the display region 10 to the peripheral region 20. For example, the buffer layer 111, the gate insulation layer 113, and the insulation interlayer 116 may each be disposed on an entire surface of the substrate 110. Furthermore, the substrate 110, the buffer layer 111, the gate insulation layer 113, and the insulation interlayer 116 may be sequentially stacked.

A data conductor may be disposed on the insulation interlayer 116. The data conductor may be disposed in the display region 10 of the display device 100. The data conductor may include a data line 119, a source electrode 117, and a drain electrode 118. The data line 119 may transmit a data signal. The data line 119 may cross the gate line 115. The source electrode 117 may be connected to the data line 119. The drain electrode 118 may be separated from the data line 119. The source electrode 117 and the drain electrode 118 may each be disposed over the active pattern 112. The source electrode 117 and the drain electrode 118 may be spaced apart from each other. The source electrode 117 and the drain electrode 118 may face each other. The source electrode 117 and the drain electrode 118 may be connected to the source region and the drain region of the active pattern 112, for example, through the first and second contact holes, respectively. The gate electrode 114 may be disposed between the source electrode 117 and the drain electrode 118. The source electrode 117 and the drain electrode 118 may be disposed on each of the insulation interlayer 116 and the active pattern 112. The source electrode 117 and the drain electrode 118 may each be disposed at least partially through the gate insulation layer 113 and through the insulation interlayer 116.

The thin film transistor may include the active pattern 112, the gate electrode 114, the source electrode 117, and the drain electrode 118. However, a structure of the thin film transistor is not limited thereto.

Referring to FIG. 3, the pad electrode 120 may be disposed at the pad portion 30 in the peripheral region 20 of the display device 100. The pad electrode 120 may be electrically connected to the conductive layer 170 of a touch sensor. The conductive layer 170 may be disposed on the planarization layer 160. The pad electrode 120 may transmit a driving signal to the conductive layer 170. Alternatively, the pad electrode 120 may receive a sensing signal from the conductive layer 170.

According to an exemplary embodiment of the present invention, the pad electrode 120 may be disposed on the insulation interlayer 116 as illustrated in FIG. 3. Thus, the data conductor may include the pad electrode 120, the data line 119, the source electrode 117, and the drain electrode 118. According to an exemplary embodiment of the present invention, the pad electrode 120 may be disposed on the gate insulation layer 113. Thus, the gate conductor may include the pad electrode 120, the gate line 115, and the gate electrode 114.

A passivation layer 121 may be disposed on the insulation interlayer 116. The passivation layer 121 may at least partially cover the data conductor. For example, the passivation layer 121 may cover the data conductor including the pad electrode 120, the data line 119, the source electrode 117, and the drain electrode 118. The passivation layer 121 may have multiple layers. For example, the passivation layer 121 may include at least one of an inorganic layer and an organic layer. The passivation layer 121 may include a contact hole. The contact hole may expose the drain electrode 118.

The pixel electrode 130 may be disposed on the passivation layer 121. The pixel electrode 130 may be connected to the drain electrode 118, for example, through the contact hole formed in the passivation layer 121. The pixel electrode 130 may include a transflective conductive material. Alternatively, the pixel electrode 130 may include a reflective conductive material.

A pixel defining layer 122 may be disposed on the passivation layer 121. The pixel defining layer 122 may at least partially cover the pixel electrode 130. For example, the pixel defining layer 122 may cover side surfaces and a portion of an upper surface of the pixel electrode 130. The pixel defining layer 122 may include an opening portion. The opening portion may expose at least a portion of the pixel electrode 130. The opening portion may define a pixel region, for example, from which light may be emitted.

According to an exemplary embodiment of the present invention, the passivation layer 121 and the pixel defining layer 122 may extend from the display region 10 to a portion adjacent to a boundary between the display region 10 and the peripheral region 20. In other words, an end of the passivation layer 121 and an end of the pixel defining layer 122 may be located at a portion adjacent to a boundary between the display region 10 and the peripheral region 20 as illustrated in FIG. 3. According to an exemplary embodiment of the present invention, the passivation layer 121 and the pixel defining layer 122 may only be disposed in the display region 10. The passivation layer 121 and the pixel defining layer 122 might not completely cover the pad portion 30 in the peripheral region 20. Therefore, the pad electrode 120 may be at least partially exposed.

A light-emitting member may be disposed on each of the pixel electrode 130 and the pixel defining layer 112. The light-emitting member may include a first organic common layer, an organic light-emitting layer 135, and a second organic common layer. The first organic common layer, the organic light-emitting layer 135, and the second organic common layer may be sequentially layered.

For example, the first organic common layer may include at least one of a hole injection layer (HIL) and a hole transport layer (HTL). The hole injection layer (HIL) and the hole transport layer (HTL) may be sequentially layered. The first organic common layer may be disposed on an entirety of the display region 10. Alternatively, the first organic common layer may be disposed in each pixel region.

The organic light-emitting layer 135 may be disposed on the pixel electrode 130 of the pixel. The organic light-emitting layer 135 may be disposed on the pixel electrode 130 and the pixel defining layer 122. The organic light-emitting layer 135 may include an organic material. The organic material may emit red light, green light, or blue light. The organic light-emitting layer 135 may include multiple layers. The organic light-emitting layer 135 may include a plurality of organic material layers. The plurality of organic material layers may emit light having different colors from each other.

For example, the second organic common layer may include at least one of an electron transport layer (ETL) or an electron injection layer (EIL). The electron transport layer (ETL) and the electron injection layer (EIL) may be sequentially layered. The second organic common layer may be disposed on an entirety of the display region 10. Alternatively, the second organic common layer may be disposed in each pixel region.

The first and second organic common layers may increase light emission efficiency of the organic light-emitting layer 135. In some exemplary embodiments of the present invention, the first organic common layer or the second organic common layer may be omitted. For example, the light-emitting member may include the first organic common layer and the organic light-emitting layer 135. Alternatively, the light-emitting member may include the second organic common layer and the organic light-emitting layer 135.

The opposite electrode 140 may be disposed on the light-emitting member. For example, the opposite electrode 140 may be disposed on the organic light-emitting layer 135. The opposite electrode 140 may transmit a common voltage. The opposite electrode 140 may include a transparent conductive material. For example, the opposite electrode 140 may include a layer including a transparent conductive material or a relatively slim metal layer. The relatively slim metal layer may include calcium (Ca), barium (Ba), magnesium (Mg), aluminum (Al), and/or silver (Ag).

A light emitting-element may include the pixel electrode 130 of each pixel, the light-emitting member, and the opposite electrode 140. The pixel electrode 130 or the opposite electrode 140 may serve as an anode, and the other of the pixel electrode 130 or the opposite electrode 140 may serve as a cathode. For example, the pixel electrode 130 may serve as an anode and the opposite electrode 140 may serve as a cathode. Alternatively, the opposite electrode 140 may serve as an anode and the pixel electrode 130 may serve as a cathode.

According to an exemplary embodiment of the present invention, the display device 100 may be a top-emission type display device. Thus, the display device 100 may emit internal light upwardly from the light-emitting element and may accordingly display an image.

The encapsulation member 150 may be disposed on the opposite electrode 140. The encapsulation member 150 may encapsulate at least a portion of the light-emitting member and at least a portion of the opposite electrode 140. For example, the encapsulation member 150 may completely encapsulate the light-emitting member and the opposite electrode 140. Thus, moisture and/or oxygen from the outside may be reduced or prevented from passing through the display device 100.

The encapsulation member 150 may include a plurality of encapsulation layers. The encapsulation member 150 may include at least one inorganic layer 151 and at least one organic layer 152. The inorganic layer 151 and the organic layer 152 may be alternately layered. The inorganic layer 151 may include inorganic material such as aluminum oxide (AlOx), silicon oxide (SiOx), and/or silicon nitride (SiNx). The organic layer 152 may include organic material. The organic layer 152 may be substantially flat.

Referring to FIGS. 2 and 3, the encapsulation member 150 may include a first inorganic layer 151a, a first organic layer 152a, a second inorganic layer 151b, a second organic layer 152b, and a third inorganic layer 151c. The first inorganic layer 151a, the first organic layer 152a, the second inorganic layer 151b, the second organic layer 152b, and the third inorganic layer 151c may be sequentially layered. However, elements and structures of the encapsulation member 150 are not limited thereto. A lowermost encapsulation layer of the plurality of the encapsulation layers may be the inorganic layer 151 or the organic layer 152. An uppermost encapsulation layer of the plurality of the encapsulation layers may be the inorganic layer 151 or the organic layer 152. When the uppermost encapsulation layer is the inorganic layer 151, moisture may be reduced or prevented from penetrating the encapsulation member 150. The inorganic layer 151 of the encapsulation member 150 may at least partially cover the organic layer 152 of the encapsulation member 150 disposed therebelow. For example, the inorganic layer 151 of the encapsulation member 150 may entirely cover the organic layer 152 of the encapsulation member 150 disposed therebelow. Thus, the organic layer 152 of the encapsulation member 150 may be covered by the inorganic layer 151 of the encapsulation member 150, and the organic layer 152 might not be exposed to the outside. Therefore, penetration moisture from the outside through the organic layer 152 of the encapsulation member 150 may be reduced or prevented.

The encapsulation member 150 may at least partially cover the display region 10 of the display device 100. For example, the encapsulation member 150 may entirely cover the display region 10 of the display device 100. Alternatively, the encapsulation member 150 may cover a portion of the peripheral region 20 of the display device 100. The encapsulation member 150 might not cover the pad portion 30 in the peripheral region 20 of the display device 100. Therefore, the pad electrode 120 may be at least partially exposed. An upper surface 153 of the encapsulation member 150 may be substantially flat. Referring to FIG. 2, the upper surface 153 of the encapsulation member 150 may be substantially flat in the entire display region 10.

Referring to FIG. 3, the encapsulation member 150 may include a sidewall 154. A height of the sidewall 154 may gradually decrease in the peripheral region 20. A thickness of the encapsulation member 150 may decrease toward an edge of the display device 100. Thus, the height of the sidewall 154 may gradually decrease. Referring to FIG. 3, sidewall 154 of the encapsulation member 150 may be positioned only in the peripheral region 20. Alternatively, the sidewall 154 of the encapsulation member 150 may be positioned in the display region 10 and the peripheral region 20 of the display device 100. Thus, the height of the encapsulation member 150 may decrease in a direction from a location in the peripheral region 20 toward an edge of the display device 100. Alternatively, the height of the encapsulation member 150 may decrease from an edge portion of the display region 10 adjacent to the boundary between the peripheral region 20 and the display region 10 toward an edge of the display device 100.

The planarization layer 160 may be disposed on the encapsulation member 150 in the display region 10 and the peripheral region 20. The planarization layer 160 may cover at least a portion of the encapsulation member 150. Referring to FIG. 1, planarization layer 160 may cover an entire surface of the encapsulation member 150. Alternatively, the planarization layer 160 may cover a portion of the encapsulation member 150. The planarization layer 160 may include at least a portion covering the sidewall 154 of the encapsulation member 150.

The planarization layer 160 may include transparent organic material. The planarization layer 160 may include a material substantially the same as or different from the organic material included in the organic layer 152. The organic material included in the planarization layer 160 may have substantially the same or different viscosity as the organic material included in the organic layer 152 of the encapsulation member 150. If the planarization layer 160 includes the transparent organic material, an efficiency of light emitted from the organic light-emitting layer 135 might not be reduced.

According to an exemplary embodiment of the present invention, the planarization layer 160 including the organic material may include a portion exposed to the outside. Penetration of moisture may occur through the exposed portion of the planarization layer 160. However, the encapsulation member 150 may be disposed below the planarization layer 160. Thus, reliability failure of the display device 100, for example, due to moisture penetration may be reduced or prevented. A substantial portion of the organic layer 152 included in the encapsulation member 150 may be covered by the inorganic layer 151. Thus, although moisture penetration may occur through the planarization layer 160, the moisture penetration might not reach the light-emitting element in the display region 10 of the display device 100.

Referring to FIG. 4, the planarization layer 160 may include a contact hole 162. The contact hole 162 may expose the pad electrode 120. For example, the planarization layer 160 may cover an edge portion of the pad electrode 120, and may expose a center portion of the pad electrode 120 through the contact hole 162. Thus, the planarization layer 160 may include a sidewall 164. The sidewall 164 may correspond to the contact hole 162.

The conductive layer 170 may be disposed on the planarization layer 160. For example, the conductive layer 170 may be a touch sensing layer included in a touch sensor that may sense a touch event. The touch event may include a case in which an external object approaches a touch surface of the display device or hovers in an approached state. The touch event may also include a case in which an external object such as a finger or the user directly contacts the touch surface of the display device. The touch sensor directly formed on an upper surface of the display device may be referred as an on-cell type touch sensor.

The conductive layer 170 may be formed along an upper surface 166 and the sidewall 164 of the planarization layer 160. The conductive layer 170 may be disposed on a portion of the pad electrode 120 exposed by the contact hole 162. Thus, the pad electrode 120 and the conductive layer 170 may be in contact with each other. The pad electrode 120 and the conductive layer 170 may also be electrically connected to each other.

According to an exemplary embodiment of the present invention, the sidewall 164 of the planarization layer 160 may have a tapered structure. If the sidewall 164 of the planarization layer 160 has a reverse-tapered structure, the conductive layer 170 might not be disposed on the sidewall 164 of the planarization layer 160. Thus, the conductive layer 170 disposed on the pad electrode 120 may be separated from the conductive layer 170 disposed on the upper surface 166 of the planarization layer 160. Accordingly, the touch sensor might not operate.

According to an exemplary embodiment of the present invention, a taper angle Θ of the sidewall 164 of the planarization layer 160 may be in a range of from about 30 degrees to about 90 degrees. When the taper angle θ is less than about 30 degrees, an area of the upper surface 166 of the planarization layer 160 may decrease, for example, due to an area of the sidewall 164 of the planarization layer 160 increasing. When the taper angle θ is greater than about 90 degrees, the touch sensor might not operate, for example, due to the sidewall 164 of the planarization layer 160 having a reverse-tapered structure as described above.

According to an exemplary embodiment of the present invention, as described above, the planarization layer 160 may cover the entire surface of the encapsulation member 150. The area of the substantially flat upper surface 166 of the planarization layer 160 may be increased. Therefore, an area for forming the conductive layer 170 on the planarization layer 160 may be increased.

If the planarization layer 160 is not formed, the conductive layer 170 may be formed only on the upper surface 153 of the encapsulation member 150 in a first comparative example. Alternatively, the conductive layer 170 may be formed on the sidewall 154 of the encapsulation member 150 corresponding to the profile of the sidewall 154 of the encapsulation member 150 in a second comparative example. In the first comparative example, a region for forming the conductive layer 170 may be limited. Thus, a dead space in which a touch is not sensed in the display device 100 may increase. In the second comparative example, a failure may occur on the conductive layer 170 according to the profile of the sidewall 154 of the encapsulation member 150, which has an uneven surface due to insulation layers and conductive layers therebelow. Thus, the touch sensor may not operate correctly.

However, the display device 100 according to an exemplary embodiment of the present invention may include the planarization layer 160. Thus, an area of the flat upper surface 166 of the planarization layer 160 may be increased. Additionally, the upper surface 166 of the planarization layer 160 may be flattened in a substantial portion of the peripheral region 20. Accordingly, a region in which the conductive layer 170 of the touch sensor is formed may operate correctly, and a dead space in which a touch is not sensed in the display device 100 may be reduced.

Parasitic capacitance may be generated between the opposite electrode 140 and the conductive layer 170 of the touch sensor. If parasitic capacitance increases, the characteristic of the touch sensor may be influenced. When the conductive layer 170 of the touch sensor is directly formed on the encapsulation member 150 without the planarization layer 160, the conductive layer 170 of the touch sensor formed on the sidewall 154 of the encapsulation member 150 may increase the parasitic capacitance between the opposite electrode 140 and the conductive layer 170 of the touch sensor. Thus, the conductive layer 170 of the touch sensor may be formed only on the flat upper surface 153 of the encapsulation member 150, and a dead space in which a touch is not sensed in the display device 100 may further increase.

However, the display device 100 according to an exemplary embodiment of the present invention may include the planarization layer 160. Thus, parasitic capacitance may be reduced between the opposite electrode 140 and the conductive layer 170. Accordingly, a touch sensitivity of the touch sensor may increase, and a dead space of the display device 100 may be reduced.

A method of manufacturing a display device according to an exemplary embodiment of the present invention will be discussed in more detail below with reference to FIGS. 2, 3, 5, 6, 7, and 8.

FIGS. 5, 6, 7, and 8 are cross-sectional views illustrating a method of manufacturing a display device of FIGS. 2 and 3 according to an exemplary embodiment of the present invention.

Figure 5:
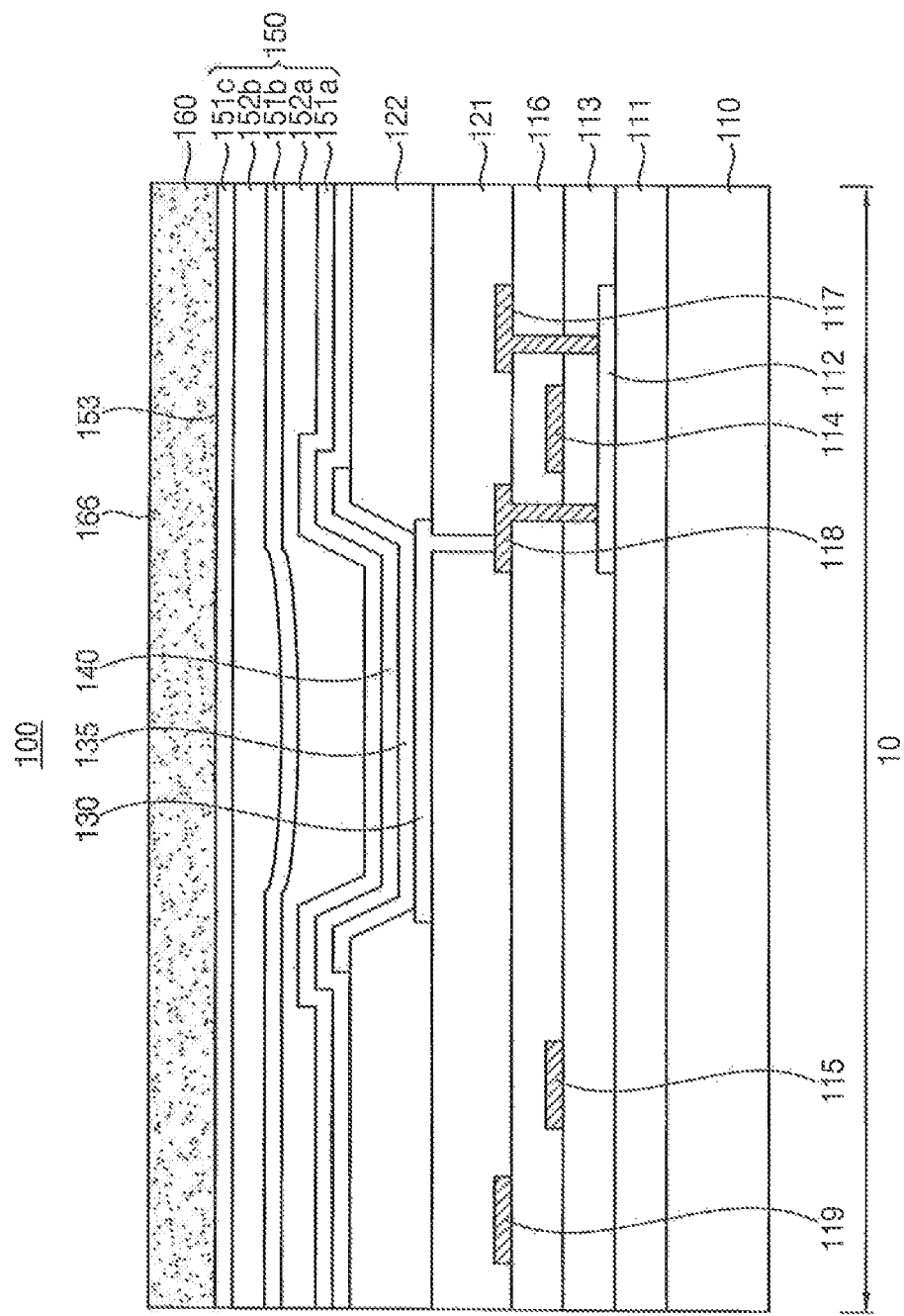
FIGS. 5, 6, 7, and 8 are cross-sectional views illustrating a method of manufacturing a display device of FIGS. 2 and 3 according to an exemplary embodiment of the present invention.
Figure 6:
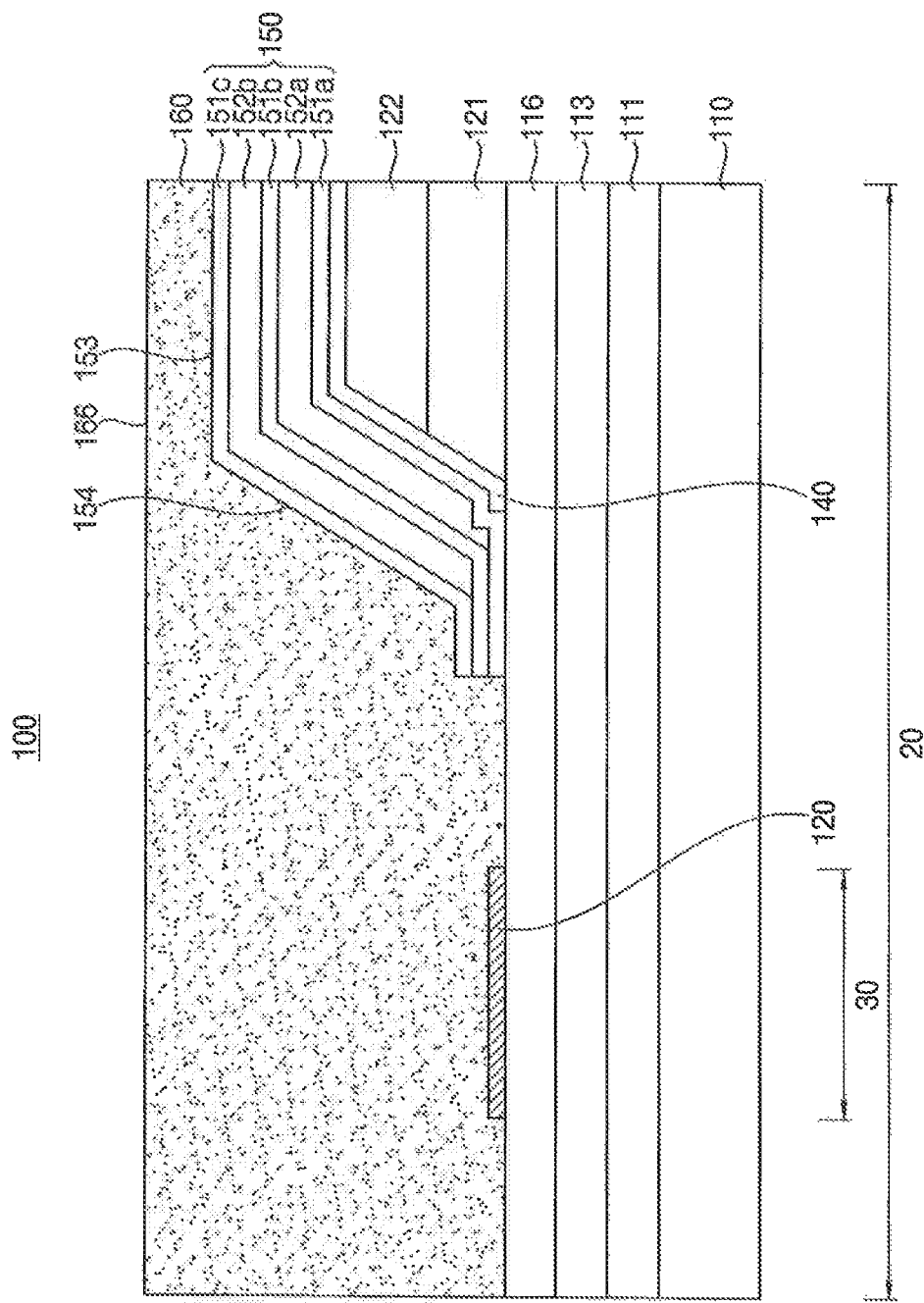

Referring to FIGS. 5 and 6, the planarization layer 160 may be formed on the substrate 110 on which the encapsulation member 150 is formed. Thus, the encapsulation member 150 and the planarization layer 160 may be sequentially layered on the substrate 110 of the display device 100. The planarization layer 160 may be formed in the display region 10 and the peripheral region 20 of the display device 100. For example, the planarization layer 160 may be formed on substantially the entire surface of the substrate 110. The planarization layer 160 may cover the encapsulation member 150 and the pad electrode 120 of FIG. 3.

According to an exemplary embodiment of the present invention, the planarization layer 160 may include a transparent organic material. The transparent organic material may be disposed on the encapsulation member 150. Thus, the transparent organic material may form the planarization layer 160. The planarization layer 160 may have a substantially flat upper surface 166 through the display region 10 and the peripheral region 20 of the display device 100.

Figure 7:
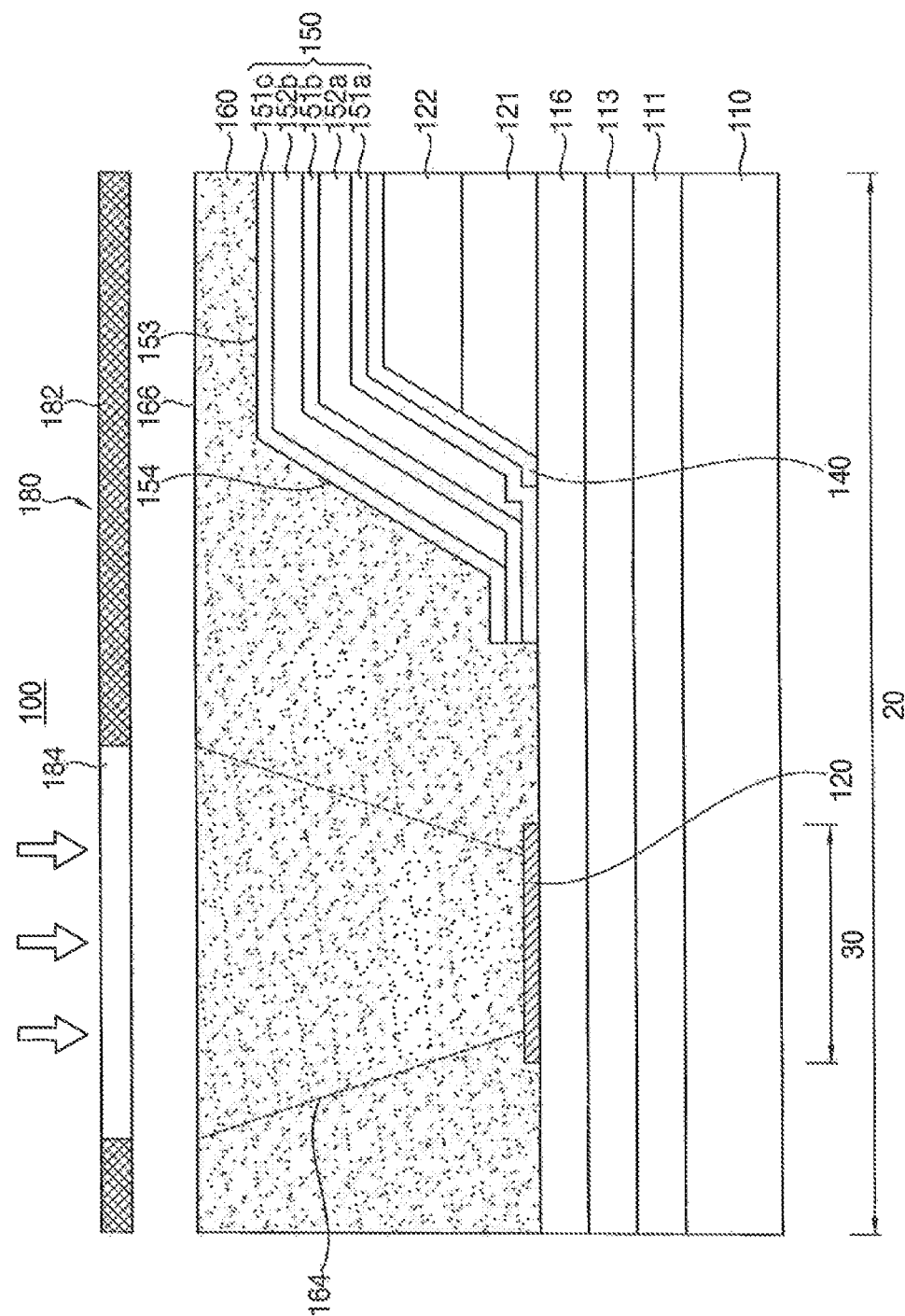

Referring to FIG. 7, a mask 180 may be positioned over the planarization layer 160. Accordingly, an exposure process may be performed. Due to the mask 180, the exposure process may be performed with different doses and at different times between a region on which the contact hole 162 is to be formed and a region on which the contact hole 162 is not to be formed.

The mask 180 may be prepared. The mask 180 may include a light blocking portion 182 and a light transmitting portion 184. The light blocking portion 182 may block substantially all light (e.g., may have a light transmittance of about 0%). The light transmitting portion 184 may transmit substantially all light (e.g., may have a light transmittance of about 100%). The exposure process may be performed by positioning the mask 180 such that the light blocking portion 182 corresponds to the region on which the contact hole 162 is not to be formed, and the light transmitting portion 184 corresponds to the region on which the contact hole 162 is to be formed.

According to an exemplary embodiment of the present invention, defocusing may be performed during the exposure process. Defocusing may cause a beam of light to be focused away from an exposed surface of the planarization layer 160. Thus, if defocusing is performed such that a beam of light is focused about 10 μm to about 15 μm from the exposed surface, the sharpness of borders of the regions exposed through the light transmitting portion 184 of the mask 180 may be reduced.

Accordingly, since the sidewall 164 of the planarization layer 160 formed by the etching process after the exposure process is gradually inclined, the sidewall 164 of the planarization layer 160 may have a tapered structure. Accordingly, if the taper angle Θ is less than about 90 degrees, the conductive layer 170 might not be disconnected. Thus, a failure of the touch sensor may be reduced or prevented. The conductive layer 170 may be formed on the planarization layer 160. If the taper angle Θ is relatively small, however, then the area of the sidewall 164 of the planarization layer 160 may increase. As the area of the sidewall 164 of the planarization layer 160 increases, the area of the upper surface 166 of the planarization layer 160 may decrease. Accordingly, the taper angle Θ may be greater than about 30 degrees.

Figure 8:
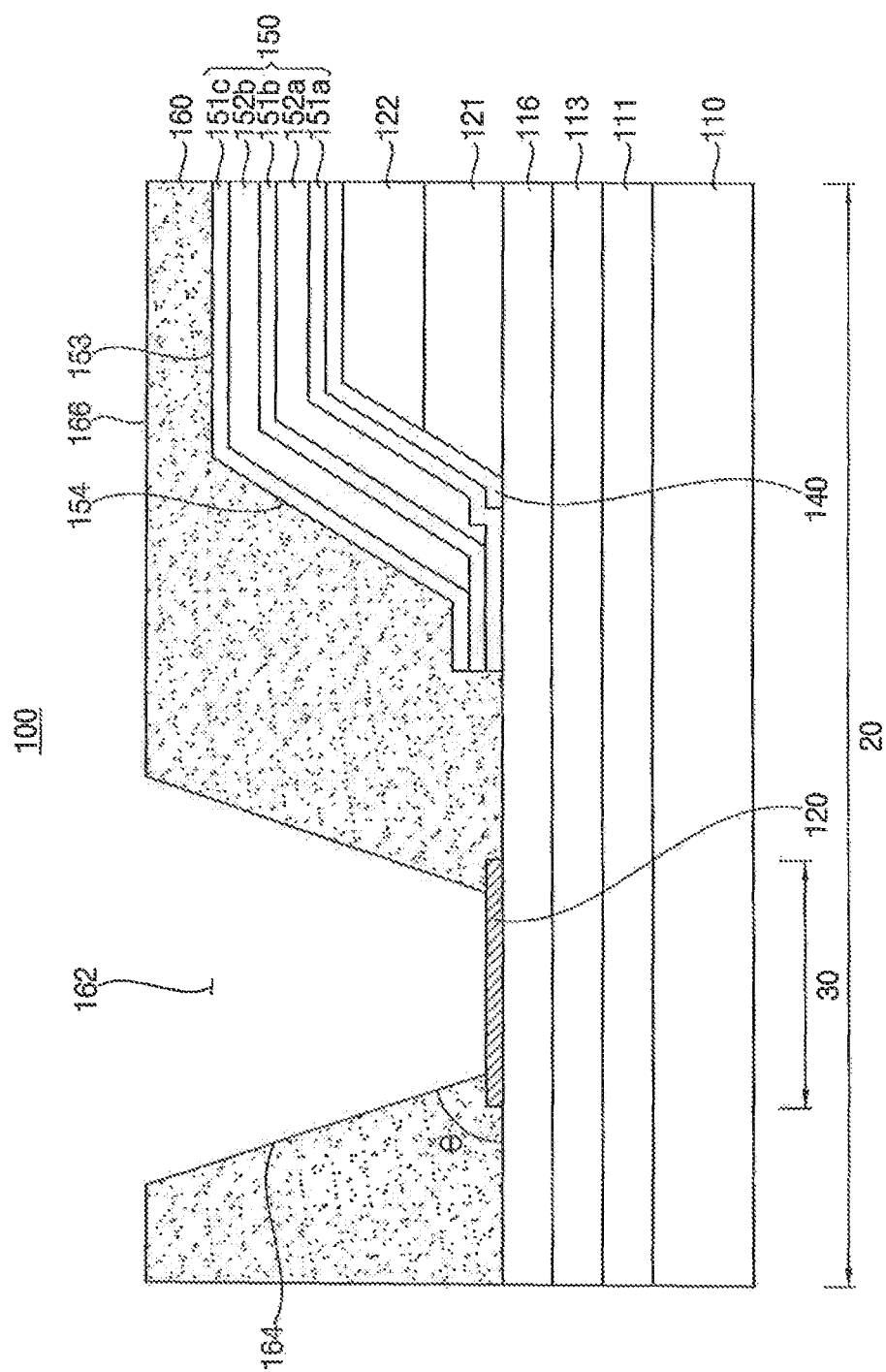

Referring to FIG. 8, the exposed planarization layer 160 may be etched to form the contact hole 162.

The region on which light is substantially blocked by the light blocking portion 182 may remain as the planarization layer 160. The region on which light is substantially transmitted by the light transmitting portion 184 may be removed by the etching process. Accordingly, the contact hole 162 may be formed. The pad electrode 120 may be exposed through the contact hole 162.

Referring to FIGS. 2 and 3, the conductive layer 170 may be formed on the planarization layer 160. The conductive layer 170 may cover the upper surface 166 and the sidewall 164 of the planarization layer 160. The conductive layer 170 may be formed in the contact hole 162 of the planarization layer 160. Thus, the conductive layer 170 may be contact the pad electrode 120 through the contact hole 162. Accordingly, the pad electrode 120 and the conductive layer 170 may be electrically connected to each other.

Hereinafter, a display device according to an exemplary embodiment of the present invention will be described in more detail with reference to FIG. 9.

Figure 9:
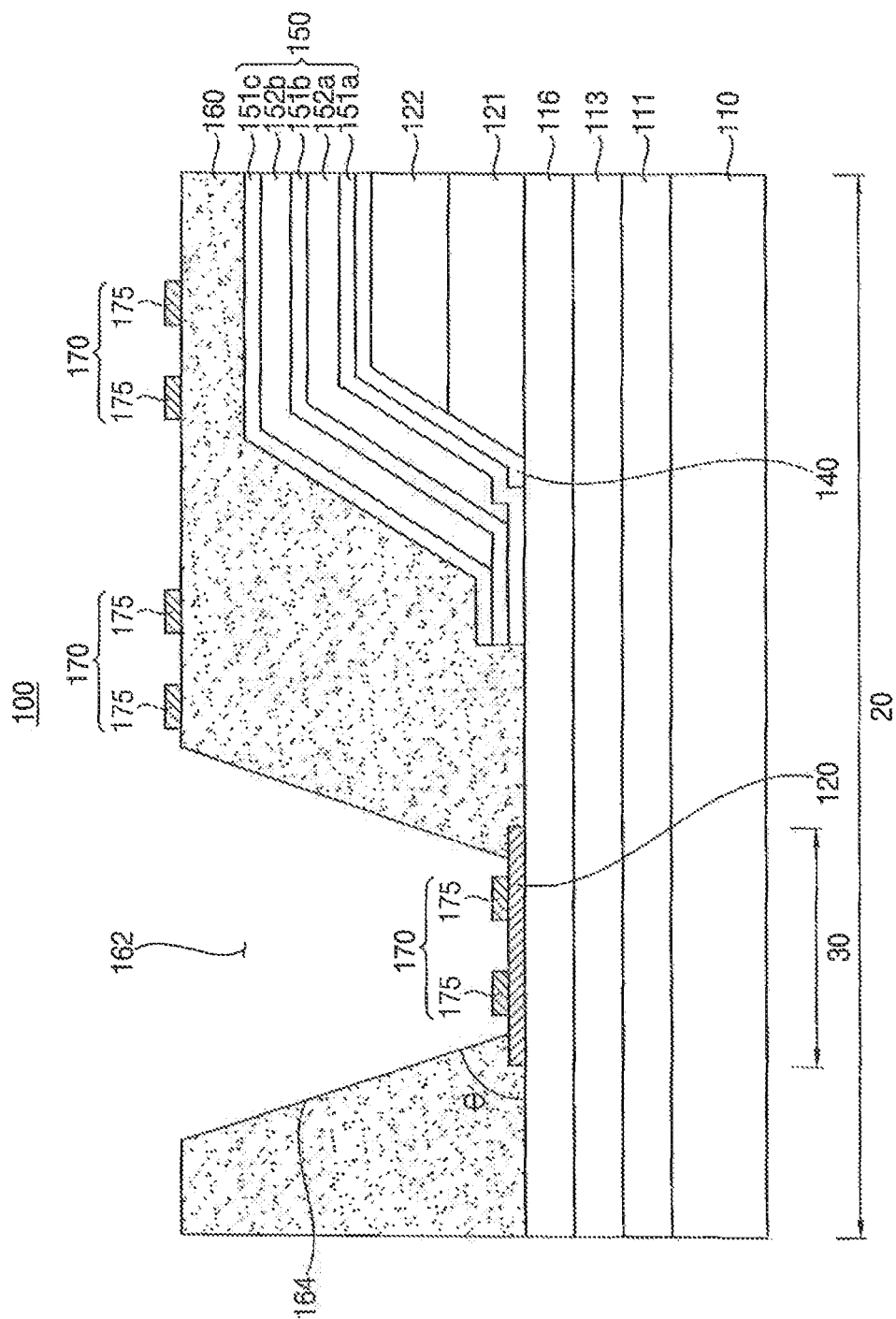
FIG. 9 is a cross-sectional view illustrating a peripheral region of a display device according to an exemplary embodiment of the present invention.

FIG. 9 is a cross-sectional view illustrating a peripheral region of a display device according to an exemplary embodiment of the present invention.

Referring to FIG. 9, the display device 100 according to an exemplary embodiment of the present invention may include the substrate 110, the pad electrode 120, the opposite electrode 140, the encapsulation member 150, the planarization layer 160, and the conductive layer 170. The display device 100 according to an exemplary embodiment of the present invention may also include the pixel electrode 130 as illustrated in FIG. 2.

The display device 100 illustrated in FIG. 9 may have elements and/or structures substantially the same as or similar to those of the display device 100 illustrated in FIGS. 2 and 3. Accordingly, detailed descriptions of similar elements and/or structures may be omitted.

The conductive layer 170 may be disposed on the planarization layer 160. For example, the conductive layer 170 may be a touch sensing layer. The touch sensing layer may be included in a touch sensor. The touch sensor may sense a touch event from the outside. The touch event may include an external object approaching a touch surface of the display device or hovering over the touch surface of the display device in an approached state. The touch event may also include an external object such as a finger or the user directly contacts the touch surface of the display device. As such, the touch sensor directly formed on an upper surface of the display device may be referred as an on-cell type touch sensor.

The conductive layer 170 may be formed along the upper surface 166 and the sidewall 164 of the planarization layer 160. The conductive layer 170 may be disposed on a portion of the pad electrode 120 exposed by the contact hole 162. Therefore, the pad electrode 120 and the conductive layer 170 may be in contact with each other. The pad electrode 120 and the conductive layer 170 may be electrically connected to each other.

The conductive layer 170 may include a plurality of conductive lines 175. The plurality of conductive lines 175 may be disposed in the contact hole 162. The plurality of conductive lines 175 may be spaced apart from each other. For example, the conductive lines 175 may be touch sensing electrodes or touch sensing lines of the touch sensor.

Hereinafter, a method of manufacturing a display device according to an exemplary embodiment of the present invention will be described in more detail below with reference to FIGS. 3, 9, 10, and 11.

Figure 10:
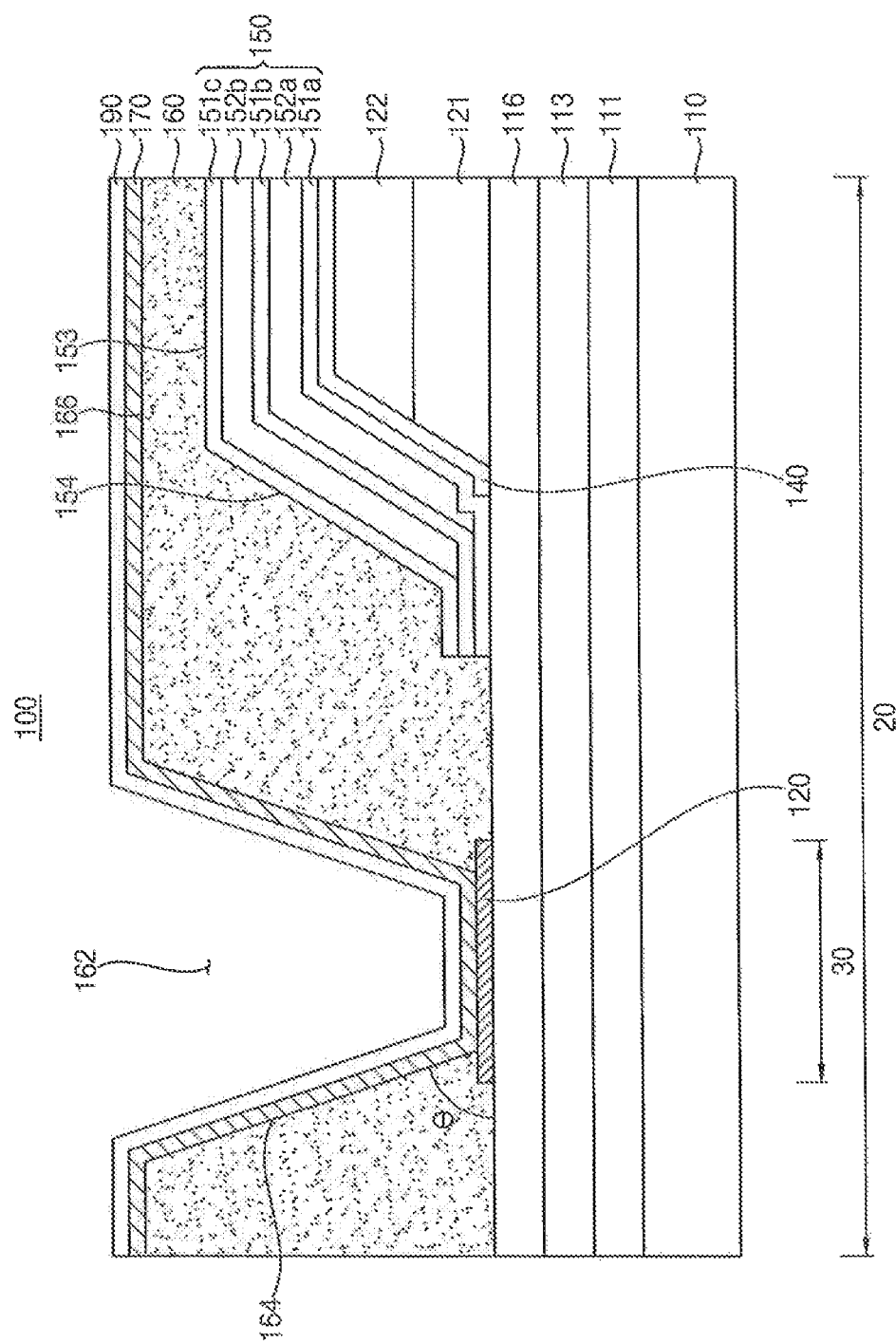
FIGS. 10 and 11 are cross-sectional views illustrating a method of manufacturing a display device of FIG. 9 according to an exemplary embodiment of the present invention.
Figure 11:
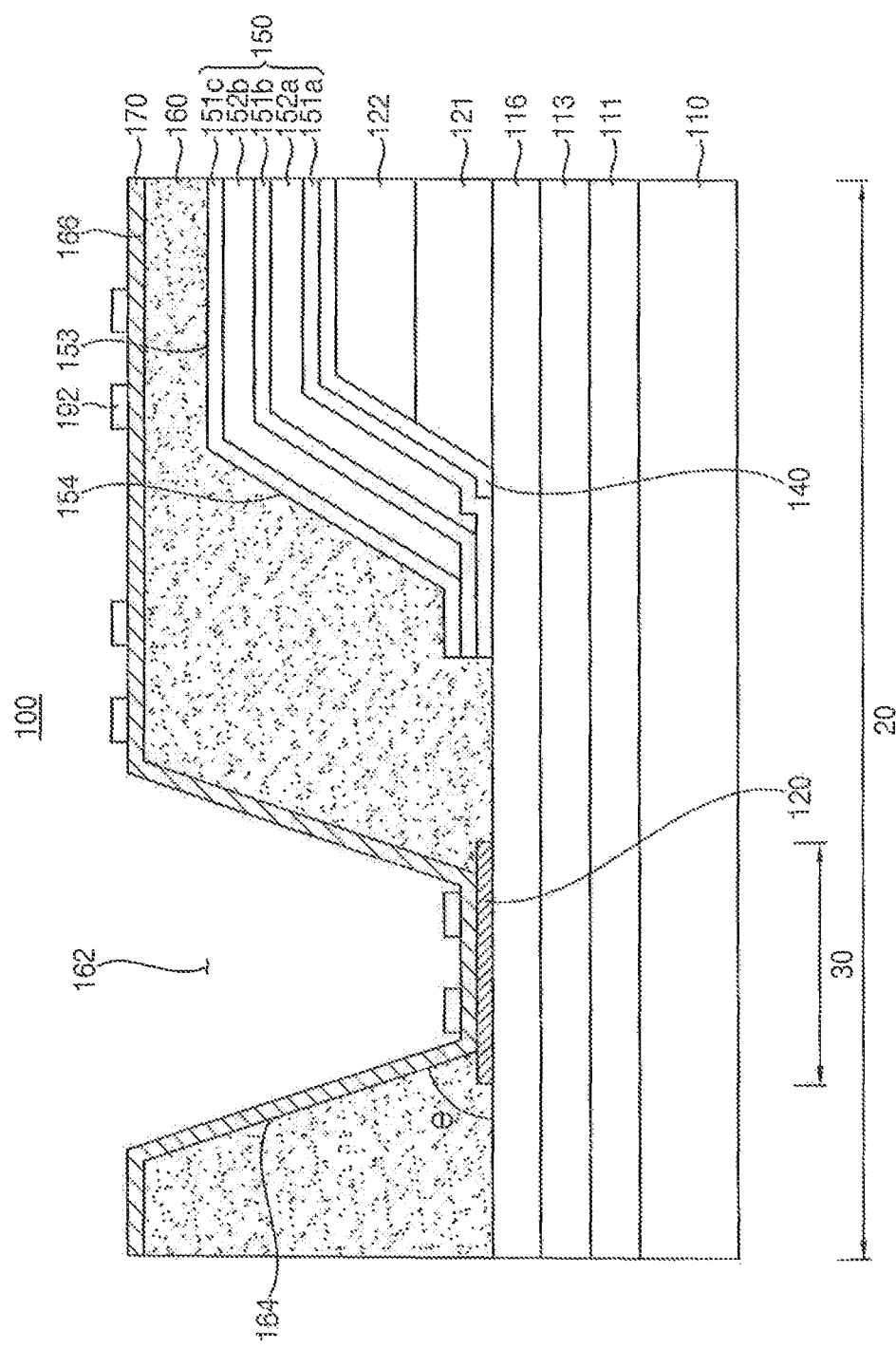

FIGS. 10 and 11 are cross-sectional views illustrating a method of manufacturing a display device of FIG. 9 according to an exemplary embodiment of the present invention.

Referring to FIG. 3, the conductive layer 170 may be formed on the planarization layer 160. The conductive layer 170 may cover the upper surface 166 and the sidewall 164 of the planarization layer 160. The conductive layer 170 may be formed in the contact hole 162 of the planarization layer 160. Thus, the conductive layer 170 may be in contact with the pad electrode 120 through the contact hole 162. Accordingly, the pad electrode 120 and the conductive layer 170 may be electrically connected to each other.

Referring to FIGS. 10 and 11, a photoresist layer 190 may be formed on the conductive layer 170. Photosensitive material may be applied on the conductive layer 170, for example, to form the photoresist layer 190. The photoresist layer 190 may have a substantially uniform thickness.

If a slope of the sidewall 164 of the planarization layer 160 is relatively steep, the photosensitive material may be cornered at an edge of the contact hole 162. Thus, a thickness of the photoresist layer 190 formed on the edge of the contact hole 162 may be relatively thick. Accordingly, the photoresist patterns 192 might not be formed due to the uneven thickness of the photoresist layer 190. However, in a method of manufacturing the display device 100 according to an exemplary embodiment of the present invention, the slope of the sidewall 164 of the planarization layer 160 may be relatively small. Thus, the photoresist layer 190 may have a substantially uniform thickness. Accordingly, the photoresist patterns 192 may be formed.

Referring to FIG. 11, the photoresist layer 190 may be etched to form the plurality of photoresist patterns 192. The plurality of photoresist patterns 192 may correspond to the plurality of conductive lines 175. For example, the photoresist layer 190 may be exposed and developed by using a mask to form the plurality of photoresist patterns 192.

Referring to FIG. 9, the conductive layer 170 may be etched by using the plurality of photoresist patterns 192 as etch-stop patterns. Accordingly, the plurality of conductive lines 175 may be formed. The remaining photoresist patterns 192 may be removed, for example, by an ashing method.

Hereinafter, a display device according to an exemplary embodiment of the present invention will be described in more detail below with reference to FIGS. 12 and 13.

FIG. 12 is a cross-sectional view illustrating a display region of a display device according to an exemplary embodiment of the present invention. FIG. 13 is a cross-sectional view illustrating a peripheral region of a display device according to an exemplary embodiment of the present invention.

Referring to FIGS. 12 and 13, the display device 100 according to an exemplary embodiment of the present invention may include the substrate 110, the pad electrode 120, the pixel electrode 130, the opposite electrode 140, the encapsulation member 150, the planarization layer 160, and the conductive layer 170.

The display device 100 illustrated in FIGS. 12 and 13 may have elements and/or structures substantially the same as or similar to those of the display device 100 illustrated in FIGS. 2 and 3 except for the structure of the planarization layer 160. Accordingly, detailed descriptions of the same elements and/or structures may be omitted.

In the display device 100 according to an exemplary embodiment of the present invention, the planarization layer 160 might not be formed on an entire surface of the encapsulation member 150. For example, the planarization layer 160 may be formed on a portion of the encapsulation member 150. The planarization layer 160 may expose a portion of the encapsulation member 150. Specifically, the planarization layer 160 may cover the sidewall 154 of the encapsulation member 150 of which height is gradually decreasing. The planarization layer 160 may expose the flat upper surface 153 of the encapsulation member 150. For example, referring to FIG. 12, the planarization layer 160 might not be disposed in the display region 10. The planarization layer 160 may only be disposed in the peripheral region 20. The planarization layer 160 may include a portion disposed in the peripheral region 20 and covers the sidewall 154 of the encapsulation member 150 as illustrated in FIG. 13.

According to an exemplary embodiment of the present invention, a transparent organic material may be applied on substantially an entire surface of the encapsulation member 150 to form a transparent organic layer. An upper portion of the transparent organic layer may be removed to form the planarization layer 160.

According to an exemplary embodiment of the present invention, the planarization layer 160 may cover the sidewall 154 of the encapsulation member 150. The upper surface 153 of the encapsulation layer 150 may be substantially flat. Accordingly, the conductive layer 170 may also be formed on the planarization layer 160. Thus, a region for forming the conductive layer 170 may be increased and a dead space of the display device 100 may be reduced.

The display device according to exemplary embodiments of the present disclosure may be applied to a display device included in, for example, a computer, a notebook, a mobile phone, a smartphone, a smart pad, a portable media player (PMP), a personal digital assistant (PDA), an MP3 player, or the like.

Although the display device and the method of manufacturing the display device according to exemplary embodiments of the present disclosure have been described with reference to the drawings, the illustrated embodiments are examples, and may be modified and changed by a person having ordinary knowledge in the relevant technical field without departing from the technical spirit of the present disclosure described in the following claims.

What is claimed is:

1. A display device, comprising:
a substrate comprising a display region and a non-display region;
a pixel electrode and an opposite electrode disposed on the substrate in the display region;
an encapsulation member disposed on the opposite electrode, the encapsulation member having a lower surface facing the substrate and an upper surface facing away from the substrate;
a planarization layer disposed on the upper surface of the encapsulation member in the non-display region; and
a conductive layer disposed on the planarization layer,
wherein the planarization layer includes a lower surface facing the substrate and an upper surface facing away from the substrate and the conductive layer is disposed on the upper surface of the planarization layer,
wherein an entirety of the upper surface of the encapsulation member is flat in the display region, and the encapsulation member includes a sidewall having a height that decreases in the non-display region, and
wherein the planarization layer is formed on a portion of the encapsulation member in the non-display region.

2. The display device of claim 1, wherein the conductive layer is a touch sensing layer included in a touch sensor.

3. The display device of claim 1, wherein the planarization layer comprises a transparent organic material.

4. The display device of claim 1, wherein the conductive layer is a sensing electrode.

5. The display device of claim 1, wherein the encapsulation member comprises an inorganic layer and an organic layer alternately layered with each other.

6. The display device of claim 5, wherein the inorganic layer at least partially covers the organic layer.

7. The display device of claim 1, wherein the planarization layer comprises a contact hole in the non-display region, and
wherein a sidewall of the planarization layer corresponding to the contact hole has a tapered structure.

8. The display device of claim 7, wherein the conductive layer comprises a plurality of conductive lines disposed in the contact hole and spaced apart from each other.

9. The display device of claim 7, wherein a taper angle of the sidewall of the planarization layer is in a range of from about 30 degrees to about 90 degrees.

10. A display device, comprising:
a substrate comprising a display region and a non-display region;
a pixel electrode and an opposite electrode disposed on the substrate in the display region;
an encapsulation member disposed on the opposite electrode, the encapsulation member having a lower surface facing the substrate and an upper surface facing away from the substrate;
a planarization layer disposed on the upper surface of the encapsulation member in the non-display region; and
a conductive layer disposed on the planarization layer,
wherein the planarization layer includes a lower surface facing the substrate and an upper surface facing away from the substrate and the conductive layer is disposed on the upper surface of the planarization layer,
wherein an entirety of the upper surface of the encapsulation member is flat in the display region, and the encapsulation member includes a sidewall having a height that decreases in the non-display region, and
wherein the planarization layer is only formed on a portion of the encapsulation member in the non-display region.

11. The display device of claim 10, wherein the conductive layer is a touch sensing layer included in a touch sensor.

12. The display device of claim 10, wherein the planarization layer comprises a transparent organic material.

13. The display device of claim 10, wherein the conductive layer is a sensing electrode.

14. The display device of claim 10, wherein the encapsulation member comprises an inorganic layer and an organic layer alternately layered with each other.

15. The display device of claim 14, wherein the inorganic layer at least partially covers the organic layer.

16. The display device of claim 10, wherein the planarization layer comprises a contact hole in the non-display region, and
wherein a sidewall of the planarization layer corresponding to the contact hole has a tapered structure.

17. The display device of claim 16, wherein the conductive layer comprises a plurality of conductive lines disposed in the contact hole and spaced apart from each other.

18. The display device of claim 16, wherein a taper angle of the sidewall of the planarization layer is in a range of from about 30 degrees to about 90 degrees.

\* \* \* \* \*